United States Patent
Hazeyama et al.

(10) Patent No.: US 7,352,069 B2
(45) Date of Patent: Apr. 1, 2008

(54) ELECTRONIC COMPONENT UNIT

(75) Inventors: Ichiro Hazeyama, Minato-ku (JP); Masahiro Kubo, Minato-ku (JP); Sakae Kitajo, Minato-ku (JP); Koji Matsui, Minato-ku (JP); Kazumasa Igarashi, Ibaraki (JP); Hiroshi Noro, Ibaraki (JP)

(73) Assignees: Nitto Denko Corporation, Osaka (JP); NEC Corporation, Tokyo (JP)

( * ) Notice: Subject to any disclaimer, the term of this patent is extended or adjusted under 35 U.S.C. 154(b) by 256 days.

(21) Appl. No.: 10/540,863

(22) PCT Filed: Dec. 24, 2003

(86) PCT No.: PCT/JP03/16632

§ 371 (c)(1),
(2), (4) Date: Nov. 22, 2005

(87) PCT Pub. No.: WO2004/059721

PCT Pub. Date: Jul. 15, 2004

(65) Prior Publication Data

US 2006/0103028 A1    May 18, 2006

(30) Foreign Application Priority Data

Dec. 25, 2002 (JP) .............................. 2002-374735

(51) Int. Cl.
    *H01L 23/29* (2006.01)
(52) U.S. Cl. ..................... 257/789; 257/778
(58) Field of Classification Search ......... 257/789, 257/778
    See application file for complete search history.

(56) References Cited

U.S. PATENT DOCUMENTS

| | | |
|---|---|---|
| 5,760,337 A | 6/1998 | Iyer et al. |
| 6,316,528 B1 | 11/2001 | Iida et al. |
| 6,674,016 B2 | 1/2004 | Kubo et al. |
| 2003/0116347 A1* | 6/2003 | Kubo et al. .............. 174/260 |
| 2007/0196612 A1* | 8/2007 | Igarashi ..................... 428/41.3 |

FOREIGN PATENT DOCUMENTS

| EP | 1 233 446 A2 | 8/2002 |
|---|---|---|
| JP | 2002-60464 A | 2/2002 |
| JP | 2003-119454 A | 4/2003 |

OTHER PUBLICATIONS

International Search Report dated Apr. 20, 2004.

\* cited by examiner

*Primary Examiner*—Jack Chen
(74) *Attorney, Agent, or Firm*—Sughrue Mion, PLLC

(57) ABSTRACT

An object of the present invention is to provide an electronic part device which can be repaired even in the case of an electronic part device having a malfunction in electrical connection after carrying out underfill.

The present invention is an electronic part device in which a semiconductor element (flip chip) (3) is mounted on a wiring circuit substrate (1) under such a state that an electrode part for connection (joint ball) disposed on the semiconductor element (flip chip) (3) and a circuit electrode (5) disposed on the wiring circuit substrate (1) are facing with each other. In addition, the gap between the wiring circuit substrate (1) and the semiconductor element (flip chip) (3) is filled by a filling resin layer (4) comprising a liquid epoxy resin composition which comprises the following component (D) and the following components (A) to (C).
(A) A liquid epoxy resin.
(B) A curing agent.
(C) An N,N,N',N'-tetra-substituted fluorine-containing aromatic diamine compound.
(D) A carboxylic acid vinyl ether addition product.

11 Claims, 1 Drawing Sheet

ELECTRONIC COMPONENT UNIT

TECHNICAL FIELD

This invention relates to an electronic part device having a flip chip connection in which facing electrodes of a semiconductor element and a circuit substrate are electrically connected via an electrode part for connection (bump), as an electronic part device which has excellent connection reliability and also has a repairability.

BACKGROUND OF THE INVENTION

In recent years, a direct chip attach system using a bare chip such as a semiconductor element flip chip or the like is drawing attention. A so-called "C4 technique" is famous as the connection method for this flip chip system, in which a high melting point solder bump is formed on the chip side, and intermetallic bonding with solder on the ceramics circuit substrate-side is carried out.

However, when a resin-based substrate such as a printed circuit substrate made of glass and an epoxy resin is used instead of the ceramics circuit substrate, it poses a problem such as insufficient connection reliability due to breaking of the solder bump bonding part caused by a difference in coefficient of thermal expansion between the chip and the resin-based substrate. As a countermeasure for such a problem, it is general to carry out a so-called underfill which is a technique in which the reliability is improved through the dispersion of thermal stress by filling the gap between the semiconductor element and the resin-based circuit substrate using, for example, a liquid resin composition.

DISCLOSURE OF THE INVENTION

However, since a thermosetting resin composition comprising an epoxy resin or the like as the main component is generally used as the liquid resin composition to be used in the aforementioned underfill, there is a problem in that repair cannot easily be carried out from the viewpoint that, once it is cured by heating, the product does not melt, shows high adhesive strength, does not decompose, or becomes insoluble in solvents. Thus, once underfill is carried out, it causes a problem in that, for example, an electronic part device having a malfunction in electrical connection must be scrapped and discarded. Under the recent year's demand for recycling ability towards global atmospheric conservation, it is necessary to avoid production of waste to the utmost, so that it is expected that repairing is possible even after underfilling.

On the other hand, in the filling method of a liquid material by the flip chip method which uses conventional solder bump, a method is employed in which a flip chip is firstly mounted on a wiring circuit substrate to form metallic bonding by a solder melting step, and then a liquid resin material is injected into the gap between the semiconductor element and wiring circuit substrate by a capillary effect. However, the aforementioned semiconductor production method has a problem in that its productivity is low because many production processes are required.

The present invention has been made by taking such circumstances into consideration, and its object is to provide an electronic part device which can be repaired even in the case of an electronic part device having a malfunction in electrical connection after carrying out underfill.

In addition, another object of the present invention is to provide a semiconductor device which uses an epoxy resin composition, has excellent productivity and renders possible mounting of flip chip by previously applying a thermosetting resin composition having a function to remove a metal oxide film or antioxidant film existing on the surface of a semiconductor element or wiring circuit substrate electrode, in producing a semiconductor device which requires metal bond formation of solder bump or the like.

In order to attain the aforementioned objects, the electronic part device of the present invention is an electronic part device comprising a semiconductor circuit substrate, a semiconductor element mounted thereon in such a way that an electrode part for connection disposed on the semiconductor element and an electrode part for connection disposed on the circuit substrate are facing with each other, and a filling resin layer which fills the gap between the circuit substrate and semiconductor element, wherein the filling resin layer comprises a liquid epoxy resin composition which comprises the following component (D) and the following components (A) to (C):

(A) a liquid epoxy resin,
(B) a curing agent,
(C) an N,N,N',N'-tetra-substituted fluorine-containing aromatic diamine compound, and
(D) a carboxylic acid vinyl ether addition product.

That is, with the aim of achieving the aforementioned objects, the present inventors have conducted studies on the epoxy resin composition as an underfill material for filling the gap between circuit substrate and semiconductor element. As a result, it was found that when (D) a carboxylic acid vinyl ether addition product is used in a liquid epoxy resin composition which uses (A) a liquid epoxy resin, (B) a curing agent and (C) an N,N,N',N'-tetra-substituted fluorine-containing aromatic diamine compound as the main components, the aforementioned filling of the gap between wiring circuit substrate and semiconductor element and metallic bonding are formed by carrying out solder melting for mounting the semiconductor element on the wiring circuit substrate via the aforementioned thermosetting resin having a function to remove antioxidant film, so that the steps for the filling of the aforementioned wiring circuit substrate and semiconductor element and for the metallic connection become simple, and remarkable shortening of the production process period can be achieved, in comparison with the conventional complex process in which a semiconductor element and a wiring circuit substrate electrode are connected through metallic bonding using a flux and then a filling resin is injected into the aforementioned gap.

Moreover, it was found that after curing of the liquid epoxy resin composition, solvation and subsequent swelling are generated in the cured product of this epoxy resin composition by the specific solvent and, as a result, reduction of film strength and reduction of adhesive strength of the cured product as a filling resin occur, so that mechanical peeling of the cured product is possible and repairing of the semiconductor element (flip chip) becomes possible, thus accomplishing the present invention. Since the aforementioned fluorine-containing aromatic diamine reduces solubility parameter (SP) value of the cured product by a trifluoromethyl substituent or a fluorine substituent, salvation and subsequent swelling are apt to occur by a specific solvent. According to the present invention, it was found that the solvation and swelling property are further improved by the use of an N,N,N',N'-tetra-substituted fluorine-containing aromatic diamine compound and the aforementioned repairing becomes possible.

Figure 1:
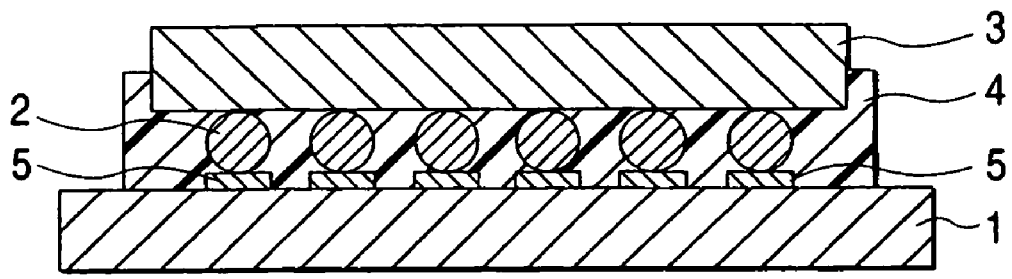
FIG. 1 is a sectional view showing the electronic part device of the present invention.

In this connection, the reference numerals in the drawings are as follows.
1: Wiring circuit substrate,
2: electrode part for connection (joint ball),
3: semiconductor element,
4: filling resin layer,
5: circuit electrode, and
10: liquid epoxy resin composition.

BEST MODE FOR CARRYING OUT THE INVENTION

Next, embodiments of the present invention are described in detail.

As shown in FIG. 1, a semiconductor element (flip chip) 3 is mounted on a wiring circuit substrate 1 in such a way that an electrode part for connection (joint ball) 2 disposed on the semiconductor element (flip chip) 3 and a circuit electrode 5 disposed on the wiring circuit substrate 1 are faced with each other. In addition, the gap between the aforementioned wiring circuit substrate 1 and semiconductor element (flip chip) 3 is filled with a filling resin layer 4 comprising a liquid epoxy resin composition.

In this connection, the aforementioned two or more of the electrode parts for the connection 2 which electrically connect the aforementioned wiring circuit substrate 1 and semiconductor element 3 may be disposed on the surface of the wiring circuit substrate 1 or disposed on the surface of the semiconductor element 3, in advance. Alternatively, they may be arranged on both of the surface of the wiring circuit substrate 1 and of the surface of the semiconductor element 3, in advance.

The material of the aforementioned two or more of the electrode parts for the connection 2 is not particularly limited, and examples thereof include low melting point and high melting point bumps by solder, tin bump, silver-tin bump, silver-tin-copper bump and the like, or gold lump, copper bump and the like when the circuit electrode 5 as an electrode part on the wiring circuit substrate 1 comprises the aforementioned material.

Also, the material of the aforementioned wiring circuit substrate 1 is not particularly limited, but is roughly divided into ceramic substrates and plastic substrates. As the aforementioned plastic substrates, for example, an epoxy substrate, a bismaleimidotriazine substrate, a polyimide substrate and the like may be cited. In addition, the liquid epoxy resin composition to be used in the present invention may be suitably used without particular limitation, even in a case in which the bonding temperature cannot be set to a high temperature due to a problem of heat resistance, such as a combination of a plastic substrate with an electrode part for connection by low melting solder.

In the aforementioned electronic part device, the electrode part for connection 2 disposed on the semiconductor element is formed into a bump shape, but not particularly limited to this shape, and the circuit electrode 5 disposed on the wiring circuit substrate 1 may be provided in a bump shape.

The liquid epoxy resin composition as the aforementioned filling resin layer 4-forming material is obtainable by formulating a carboxylic acid vinyl ether addition product (component D) together with a liquid epoxy resin (component A), a curing agent (component B) and an N,N,N',N'-tetra-substituted fluorine-containing aromatic diamine compound (component C). In this connection, regarding the liquid epoxy resin composition of the present invention, the liquid means a liquid state which shows fluidity at 25° C. That is, a state in which the viscosity is within the range of from 0.01 mPa·s to 10,000 Pa·s at 25° C. Measurement of the aforementioned viscosity may be carried out using an EMD-type rotational viscometer.

The aforementioned liquid epoxy resin (component A) is not particularly limited with the proviso that it is a liquid epoxy resin which contains two or more epoxy groups per 1 molecule. Examples thereof include bisphenol A type, bisphenol F type, hydrogenated bisphenol A type, bisphenol AF type, phenol novolak type and the like various liquid epoxy resins and derivatives thereof, a liquid epoxy resin derived from a polyhydric alcohol and epichlorohydrin and derivatives thereof, glycidylamine type, hydantoin type, aminophenol type, aniline type, toluidine type and the like various glycidyl type liquid epoxy resins and derivatives thereof (described in "*Jitsuyo Plastic Jiten Zairyo Hen* (Practical Plastics Dictionary, Materials)", edited by Jitsuyo Plastic Jiten Editorial Committee, First Edition, Third Printing, published on Apr. 20, 1996, page 211 to page 225; the contents thereof being incorporated herein by reference), and liquid mixtures of these aforementioned liquid epoxy resins with various glycidyl type solid epoxy resins, and the like. These may be used alone or as a mixture of two or more.

The aforementioned curing agent (component B) is not particularly limited with the proviso that it can cure the aforementioned liquid epoxy resin (component A), but it is desirable to use at least one of an aromatic diamine and a derivative thereof. It is more desirable to use at least one of a fluorine-containing aromatic diamine and a derivative thereof from the viewpoint that solvation and subsequent swelling by a specific solvent become easy.

Examples of the aromatic diamine in the aforementioned at least one of an aromatic diamine and a derivative thereof include p-phenylenediamine, m-phenylenediamine, 2,5-toluenediamine, 2,4-toluenediamine, 4,6-dimethyl-m-phenylenediamine, 2,4-diaminomesitylene and the like aromatic mononuclear diamines, 4,4'-diaminodiphenyl ether, 3,3'-diaminodiphenyl ether, 3,4'-diaminodiphenyl ether, 4,4',-diaminodiphenylmethane, 3,3'-diaminodiphenylmethane, 4,4',-diaminodiphenylsulfone, 3,3'-diaminodiphenylsulfone, 4,4'-diaminodiphenyl sulfide, 3,3'-diaminodiphenyl sulfide, 4,4'-diaminobenzophenone, 3,3'-diaminobenzophenone and the like aromatic dinuclear diamines, 1,4-bis(4-aminophenoxy)benzene, 1,4-bis(3-aminophenoxy)benzene, 1,3-bis(4-aminophenoxy)benzene, 1,3-bis(3-aminophenoxy)benzene and the like aromatic trinuclear diamines, 4,4'-di-(4-aminophenoxy)diphenylsulfone, 4,4'-di-(3-aminophenoxy)diphenylsulfone, 4,4'-di-(4-aminophenoxy)diphenylpropane, 4,4'-di-(3-aminophenoxy)diphenylpropane, 4,4'-di-(4-aminophenoxy)diphenyl ether, 4,4'-di-(3-aminophenoxy)diphenyl ether and the like aromatic tetranuclear diamines and the like, which may be used alone or as a mixture of two or more.

The fluorine-containing aromatic diamine in the aforementioned at least one of a fluorine-containing aromatic diamine and a derivative thereof is not particularly limited, with the proviso that it is a fluorine substituted aromatic diamine having a primary amino group, and its examples include 2,2'-di(trifluoromethyl)-4,4'-diaminobiphenyl, 2,2- bis(4-aminophenyl)hexafluoropropane, 2,2-bis(3-amino-4-methylphenyl)hexafluoropropane, 2,2-bis(3-amino-4-hydroxyphenyl)hexafluoropropane, 2,2-bis[4-(4-aminophenoxy)phenyl]hexafluoropropane, 2,2-bis(3-amino-4,5-dimethylphenyl)hexafluoropropane, 2,2-bis(4-hydroxy-3-aminophenyl)hexafluoropropane, 4,4'-bis[2-(4-carboxyphenyl)hexafluoroisopropyl]diphenyl ether, 4,4'-bis [2-(4-aminophenoxyphenyl)hexafluoroisopropyl]diphenyl ether and the like, which may be used alone or as a mixture of two or more.

Regarding the aforementioned at least one of a fluorine-containing aromatic diamine and a derivative thereof, a fluorine substituted or fluorinated alkyl substituted diaminobiphenyl represented by the following general formula (2) is suitably used, because its use prolongs pot life at room temperature.

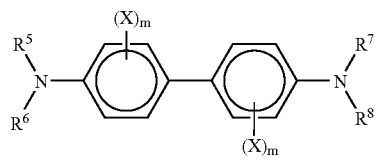

(2)

(In the formula (2), X is fluorine and/or $C_nF_{2n+1}$ (n is a positive number of from 1 to 10), two m's may be the same or different from each other and each is an integer of from 1 to 4, each of $R^5$ to $R^8$ is hydrogen or a monovalent organic group, and at least one of $R^5$ to $R^8$ is hydrogen.)

In the aforementioned formula (2), each of $R^5$ to $R^8$ is hydrogen or a monovalent organic group, and at least one of $R^5$ to $R^9$ must be hydrogen. As the aforementioned monovalent organic group, for example, saturated alkyl group represented by —$C_nH_{2n+1}$ (n is an integer of from 1 to 10), aryl group, 3-alkoxy substituted-2-hydroxypropyl group represented by —$CH_2CH(OH)CH_2$—$OC_nH_{2n+1}$, 3-aryl substituted-2-hydroxypropyl group represented by —$CH_2CH(OH)CH_2$—O—$R^9$ ($R^9$ is an aryl group), and the like may be cited. In addition, $R^5$ to $R^8$ may be the same or different from one another when the aforementioned conditions are satisfied. The aforementioned aryl group is not particularly limited, and its illustrative examples include phenyl group ($C_6H_5$—), tolyl group ($CH_3C_6H_5$—), xylyl group (($CH_3)_2C_6H_5$), biphenyl group ($C_6H_5C_6H_4$—), naphthyl group ($C_{10}H_7$—), anthryl group ($C_{14}H_9$—), phenanthryl group ($C_{14}H_9$—) and the like.

Particularly, according to the present invention, the use of 2,2'-di(trifluoromethyl)-4,4'-diaminobiphenyl having the smallest active hydrogen equivalent as the aforementioned fluorine-containing aromatic diamine is desirable from the viewpoint that the blending amount can be reduced and viscosity of the one-component non-solvent epoxy resin composition may be reduced.

Regarding the blending ratio of the liquid epoxy resin (component A) with the curing agent (component B) according to the present invention, it is desirable to set the number of active hydrogen of the aforementioned curing agent (component B) within the range of from 0.4 to 1.6 based on 1 epoxy group of the aforementioned liquid epoxy resin (component A). More desirable range is the range of from 0.6 to 1.2. That is, when the number of active hydrogen exceeds 1.6 based on 1 epoxy group, viscosity of the liquid epoxy resin composition tends to increase, and when it is less that 0.4, glass transition temperature of cured product of the liquid epoxy resin composition tends to decrease.

On the other hand, according to the present invention, when the liquid epoxy resin (component A), particularly a multifunctional aliphatic liquid epoxy resin is used, a possibility of generating voids caused by the evaporation or volatilization of low boiling point compounds contained in the multifunctional aliphatic liquid epoxy resin or the like may be reduced, by making at least one of the aforementioned fluorine-containing aromatic diamine and a derivative thereof and the multifunctional aliphatic liquid epoxy resin into a prepolymer through their preliminary reaction.

The aforementioned prepolymer may be obtained, for example, by allowing at least one of a fluorine-containing aromatic diamine and a derivative thereof to react with a multifunctional aliphatic liquid epoxy compound having two or more epoxy groups in one molecule. In general, the prepolymer is prepared by putting predetermined amounts of respective components into a reaction vessel, and carrying out the reaction at a temperature of from 60 to 120° C. in a stream of nitrogen and under the absence of catalyst until a predetermined molecular weight is obtained. Regarding the molecular weight of this prepolymer, it is desirable to use a prepolymer prepared by reacting until its polystyrene based weight average molecular weight becomes approximately from 400 to 5,000, and by preparing such a prepolymer, generation of voids in the underfill filling resin layer caused by the evaporation or volatilization of volatile low boiling point low molecular weight compounds can be prevented.

Illustrative examples of the aforementioned multifunctional aliphatic liquid epoxy resin include ethylene glycol diglycidyl ether, propylene glycol diglycidyl ether, butanediol diglycidyl ether, neopentyl glycol diglycidyl ether, diglycidylaniline, trimethylolpropane diglycidyl ether, trimethylolpropane triglycidyl ether, glycerol diglycidyl ether, glycerol triglycidyl ether and the like aliphatic diols and triols, or multifunctional glycidyl ethers of aliphatic multifunctional alcohols and the like.

The N,N,N',N'-tetra-substituted fluorine-containing aromatic diamine compound (component C) to be used together with the aforementioned liquid epoxy resin (component A) and curing agent (component B) is illustratively a compound represented by the following general formula (1), which may be obtained, for example, by allowing the aforementioned fluorine-containing aromatic diamine to react with a monoepoxy compound containing 1 epoxy group in 1 molecule.

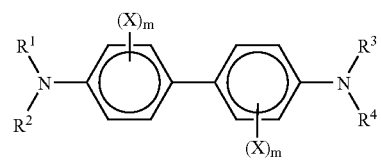

(1)

(In the formula (1), X is fluorine and/or $C_nF_{2n+1}$ (n is a positive number of from 1 to 10), two m's may be the same or different from each other and each is an integer of from 1 to 4, $R^1$ to $R^4$ are monovalent organic groups other than hydrogen, which may be the same or different from one another.)

In the aforementioned formula (1), $R^1$ to $R^4$ are monovalent organic groups other than hydrogen, and their examples include saturated alkyl group represented by —$C_nH_{2n+1}$ (n is an integer of from 1 to 10), aryl group, 3-alkoxy substituted- 2-hydroxypropyl group represented by —CH$_2$CH(OH)CH$_2$—OC$_n$H$_{2n+1}$, 3-aryl substituted-2-hydroxypropyl group represented by —CH$_2$CH(OH)CH$_2$—O—R$^9$ (R$^9$ is an aryl group), and the like. In addition, R$^1$ to R$^4$ may be the same or different from one another. The aforementioned aryl group is not particularly limited, and its illustrative examples include phenyl group (C$_6$H$_5$—), tolyl group (CH$_3$C$_6$H$_5$—), xylyl group ((CH$_3$)$_2$C$_6$H$_5$), biphenyl group (C$_6$H$_5$C$_6$H$_4$—), naphthyl group (C$_{10}$H$_7$—), anthryl group (C$_{14}$H$_9$—), phenanthryl group (C$_{14}$H$_9$—) and the like.

Regarding the aforementioned reaction of a fluorine-containing aromatic diamine with a mono-epoxy compound containing 1 epoxy group in 1 molecule, the reaction may be carried out by putting predetermined amounts of respective components into a reaction vessel, and heating them at a temperature of approximately from 60 to 120° C. in a stream of nitrogen and under the absence of catalyst until epoxy group is consumed, and the tetra-substitution compound represented by the aforementioned general formula (1) is obtained by this reaction.

The aforementioned mono-epoxy compound is not particularly limited with the proviso that it is an epoxy compound containing 1 epoxy group in 1 molecule, and its examples include n-butyl glycidyl ether, allyl glycidyl ether, 2-ethylhexyl glycidyl ether, styrene oxide, phenyl glycidyl ether, cresyl glycidyl ether, lauryl glycidyl ether, p-sec-butylphenyl glycidyl ether, nonylphenyl glycidyl ether, glycidyl ether of carbinol, glycidyl methacrylate, vinylcyclohexene monoepoxide, α-pinene oxide and the like. These may be used alone or as a mixture of two or more.

It is desirable to set blending ratio of the aforementioned N,N,N',N'-tetra-substituted fluorine-containing aromatic diamine compound (component C) within a range of from 10 to 70% by weight based on the entire organic components of the liquid epoxy resin composition. It is set to more preferably from 30 to 60% by weight, particularly preferably from 20 to 40% by weight. That is, this is because repair by quick swelling can hardly be taken place when it is less than 10% by weight, and on the other hand, when it exceeds 70% by weight, strength of cured product of the liquid epoxy resin composition tend to become insufficient, thus showing a tendency in that a mechanical strength which can endure the temperature cycle may not be maintained.

According to the present invention, various conventionally known curing accelerators may be used for shortening the curing time. Illustrative examples thereof include 1,8-diazabicyclo(5,4,0)undecane-7, triethylene diamine and the like tertiary amines, 2-methylimidazole and the like imidazoles, triphenylphosphine, tetraphenylphosphonium tetraphenylborate and the like phosphorus-based curing accelerators, salicylic acid and the like acid catalysts, acetylacetonatocupper, acetylacetonatozinc and the like Lewis acids, and the like. These may be used alone or as a mixture of two or more.

Particularly, according to the present invention, it is desirable to use tetraphenylphosphonium tetraphenylborate and the like phosphonium salts or acetylacetonatocupper, acetylacetonatozinc and the like Lewis acids as the aforementioned curing accelerators, because they do not spoil stability of the liquid epoxy resin composition.

The blending amount of the aforementioned curing accelerator is not particularly limited, but it is desirable to appropriately set it to such a ratio that the desired curing rate may be obtained based on the mixture of the aforementioned liquid epoxy resin (component A), curing agent (component B) and N,N,N',N'-tetra-substituted fluorine-containing aromatic diamine compound (component C). For example, the amount for use may be easily decided by measuring gelation time using a heating plate, as an index of the curing rate. As an example thereof, it is desirable to set it within a range of from 0.01 to 3% by weight, based on the entire liquid epoxy resin composition.

As the carboxylic acid vinyl ether addition product (component D) as a flux component to be used together with the aforementioned liquid epoxy resin (component A), curing agent (component B) and N,N,N',N'-tetra-substituted fluorine-containing aromatic diamine compound (component C), the carboxylic acid monovinyl ether addition product represented by the following general formula (3), compounds consisting of organic carboxylic acids and vinyl ether compounds such as the polyvalent carboxylic acid polyvalent vinyl ether addition product represented by the following general formula (4) may be used, though not particularly limited thereto with the proviso that they have these structures. For example, as the aforementioned organic carboxylic acid, formic acid, acetic acid, propionic acid, butyric acid, valeric acid, caproic acid, caprylic acid, lauric acid, myristic acid, palmitic acid, stearic acid, oleic acid, linoleic acid, linolenic acid, cyclohexanecarboxylic acid, phenylacetic acid, benzoic acid, o, m, p-toluic acid, o, m, p-chlorobenzoic acid, o m, p-bromobenzoic acid, o, m, p-nitrobenzoic acid and the like monocarboxylic acids, oxalic acid, malonic acid, succinic acid, glutaric acid, adipic acid, maleic acid, fumaric acid, phthalic acid, isophthalic acid, terephthalic acid, itaconic acid, acrylic acid and the like dicarboxylic acids, trimellitic acid, pyromellitic acid, isocyanuric acid, carboxyl group-containing polybutadiene and the like polycarboxylic acids and the like. In addition, as the aforementioned vinyl ether compound, vinyl ether compounds having butyl group, ethyl group, propyl group, isopropyl group, cyclohexyl group, allyl group and the like organic groups of monovalent or more may be exemplified. By the use of a compound of such a structure, the component D as a flux activator can exert flux effect in the semiconductor mounting process and then react with the epoxy resin composition, so that it may be suitably used as a material having both functions as the flux component and the curing agent.

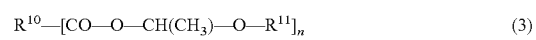

$$R^{10}—[CO—O—CH(CH_3)—O—R^{11}]_n \qquad (3)$$

(In the formula (3), R$^{10}$ is an organic group of monovalent or more, R$^{11}$ is an organic group of monovalent or more, and they may be the same or different from each other. Also, n is a positive integer, preferably a positive integer of from 1 to 4.)

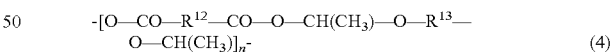

$$-[O—CO—R^{12}—CO—O—CH(CH_3)—O—R^{13}—O—CH(CH_3)]_n- \qquad (4)$$

(In the formula (4), R$^{12}$ and R$^{13}$ are divalent organic groups, and they may be the same or different from each other. Also, n is a positive integer, preferably a positive integer of from 1 to 4.)

Particularly preferably, an adipic acid cyclohexyl divinyl ether addition product which is obtained using adipic acid as the organic carboxylic acid and a vinyl ether compound having cyclohexyl group as the vinyl ether compound, maleic acid cyclohexyl divinyl ether addition product or the like may be exemplified, from the viewpoint that it forms a three dimensional cross-linking structure with epoxy resin.

From the viewpoint of solder persistency, heat resistance and excess moisture tolerance reliability, it is desirable to set the containing ratio of the aforementioned carboxylic acid vinyl ether addition product (component D) as the flux component within a range of from 0.1 to 20% by weight, more preferably from 0.5 to 15% by weight, particularly preferably from 1.0 to 10% by weight, based on the entire organic components. That is, this is because the flux activity tends to become insufficient when it is less that 0.1% by weight, and glass transition temperature of the cured product tends to reduce when it exceeds 20% by weight.

In addition, 0.5% by weight or more is desirable because a tendency of rapidly becoming insufficient in flux activity is not found, and 15% by weight or less is desirable because a tendency of slightly reducing glass transition temperature of the cured product is not found.

According to the present invention, an inorganic filler can also be added within such a range that malfunction does not occur in the metallic bonding of the bump electrode part of semiconductor element flip chip with the electrode part of wiring circuit substrate. As such an inorganic filler, silica powder of synthetic silica, fused silica or the like, and various powders such as of alumina, silicon nitride, aluminum nitride, boron nitride, magnesia, calcium silicate, magnesium hydroxide, aluminum hydroxide, titanium oxide and the like may be exemplified. Among the aforementioned inorganic fillers, it is desirable to use spherical silica powder because of its large effect to reduce viscosity of the liquid epoxy resin composition. Also, as the aforementioned inorganic filler, it is desirable to use a powder having a maximum particle diameter of 24 µm or less. In addition, a filler having the aforementioned maximum particle diameter and also having an average particle diameter of 10 µm or less is preferably used, and a filler having an average particle diameter of from 1 to 8 µm is suitably used. In this connection, the aforementioned maximum particle diameter and average particle diameter may be measured, for example, using a laser diffraction scattering type particle size distribution analyzer.

It is desirable to set the blending amount of the aforementioned inorganic filler within a range of from 10 to 80% by weight based on the entire liquid epoxy resin composition, and it is particularly preferably from 40 to 70% by weight. This is because there is a tendency that the effect of the cured product of liquid epoxy resin composition to reduce coefficient of linear expansion becomes small when the blending amount is less than 10% by weight, and there is a tendency that viscosity of the liquid epoxy resin composition increases when it exceeds 80% by weight.

In this connection, in addition to the aforementioned liquid epoxy resin (component A), curing agent (component B), N,N,N',N'-tetra-substituted fluorine-containing aromatic diamine compound (component C), carboxylic acid vinyl ether addition product (component D), curing accelerator and inorganic filler, the liquid epoxy resin composition of the present invention may jointly use a silane coupling agent for the purpose of superior bonding with an adherend, enhancing interface bonding with various inorganic fillers, and the like. The aforementioned silane coupling agent is not particularly limited, and its examples include β-(3,4-epoxycyclohexyl)ethyl trimethoxysilane, γ-glycidoxypropyl trimethoxysilane, γ-glycidoxypropyl methyldiethoxysilane and the like.

Also, in addition to the aforementioned respective components, a reactive diluent can also be formulated optionally for the purpose of effecting viscosity reduction and the like. Since this reactive diluent sometimes contains volatile low boiling point compounds, it is desirable to use it by removing in advance volatile evaporating low boiling point compounds which cause generation of voids in the filling resin layer at a predetermined curing temperature of the liquid epoxy resin composition as the underfill resin, as described in the foregoing. In addition, when the reactive diluent itself is volatile, voids are apt to be generated in the filling resin layer at a predetermined curing temperature of the liquid epoxy resin composition as the underfill resin, so that it is desirable to limit use of such a reactive diluent.

Examples of the aforementioned reactive diluent include n-butyl glycidyl ether, allyl glycidyl ether, 2-ethylhexyl glycidyl ether, styrene oxide, phenyl glycidyl ether, cresyl glycidyl ether, lauryl glycidyl ether, p-sec-butylphenyl glycidyl ether, nonylphenyl glycidyl ether, glycidyl ether of carbinol, glycidyl methacrylate, vinylcyclohexene monoepoxide, α-pinene oxide, glycidyl ether of a tertiary carboxylic acid, diglycidyl ether, glycidyl ether of (poly)ethylene glycol, glycidyl ether of (poly)propylene glycol, glycidyl ether of poly(propylene glycol), propylene oxide addition product of bisphenol A, partial addition product of a bisphenol A type epoxy resin with a polymerized fatty acid, polyglycidyl ether of a polymerized fatty acid, diglycidyl ether of butanediol, vinylcyclohexene dioxide, neopentyl glycol diglycidyl ether, diglycidylaniline, trimethylolpropane diglycidyl ether, trimethylolpropane triglycidyl ether, glycerol diglycidyl ether, glycerol triglycidyl ether and the like. These may be used alone or as a mixture of two or more.

Also, in addition to the aforementioned respective components, antimony trioxide, antimony pentoxide, brominated epoxy resin or the like flame retardant or flame retardant co-agent, silicone or the like low tress providing agent, a coloring agent and the like may be optionally formulated in the liquid epoxy resin composition of the present invention, within such a range that the gist of the present invention is not spoiled.

The liquid epoxy resin composition according to the present invention may be produced, for example, in the following manner. That is, a one-component non-solvent liquid epoxy resin composition may be produced by blending predetermined amounts of the aforementioned liquid epoxy resin (component A), curing agent (component B), inorganic filler (component C), N,N,N',N'-tetra-substituted fluorine-containing aromatic diamine compound (component D) and, as occasion demands, curing accelerator and the like, mixing and dispersing them under a high shearing force of three rollers, homo-mixer or the like, and as occasion demands, effecting degassing under a reduced pressure.

In the electronic part device of the present invention, a semiconductor element is mounted on a wiring circuit substrate via two or more electrode parts for connection, and the gap between the aforementioned wiring circuit substrate and semiconductor element is filled with a filling resin layer prepared using the aforementioned liquid epoxy resin composition. The aforementioned filling resin layer may be formed by putting the aforementioned liquid epoxy resin composition between the aforementioned wiring circuit substrate and semiconductor element, and then curing the composition. An example of the embodiment of the production method of such an electronic part device of the present invention is described in regular order based on the drawings.

Figure 2:
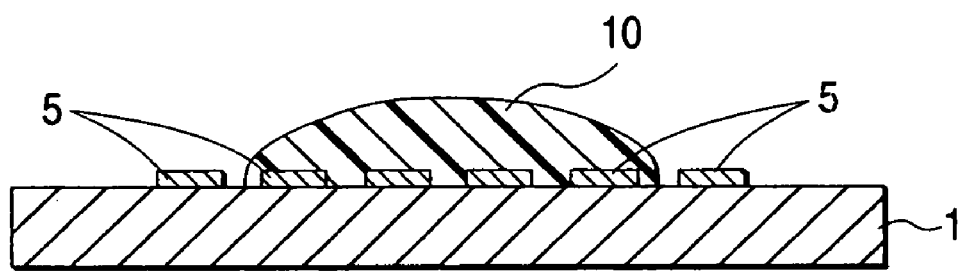
FIG. 2 is a sectional view showing production process of the aforementioned electronic part device.
Figure 3:
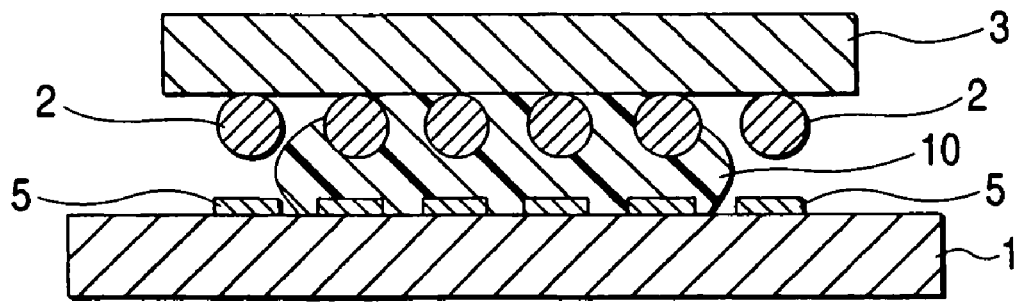
FIG. 3 is a sectional view showing production process of the aforementioned electronic part device.

That is, filling of the gas between the semiconductor element (flip chip) and wiring circuit substrate which uses the liquid epoxy resin composition of the present invention is carried out, for example, in the following manner. Firstly, as shown in FIG. 2, the liquid epoxy resin composition 10 of the present invention is put on the wiring circuit substrate 1 equipped with the circuit electrode 5. Next, as shown in FIG. 3, the semiconductor element 3 equipped with two or more of the spherical electrode part for connection (joint ball) 2 is put on a predetermined position of the liquid epoxy resin composition 10 of the present invention, the aforementioned liquid epoxy resin composition 10 is melted on a heating stage to reduce its viscosity, the liquid epoxy resin composition 10 wherein the aforementioned electrode part for connection of the semiconductor element 3 became the aforementioned state is pushed away, and the aforementioned liquid epoxy resin composition 10 under the aforementioned low viscosity condition is filled into the gap between the aforementioned semiconductor element 3 and the aforementioned wiring circuit substrate 1, where the circuit electrode 5 on the wiring circuit substrate 1 and the electrode part for connection 2 are contacted with each other. Thereafter, metallic bonding by solder reflow is carried out, and then the filling resin layer 4 is formed by filling the aforementioned gap through curing of the liquid epoxy resin composition 10. In this case, the solder reflow method may be either a bonding method which uses a reflow furnace or a bonding method in which solder melting is carried out by heating the heater part to the solder melting point or more, simultaneously with the chip mounting. In this way, as shown in FIG. 1, the electronic part device in which the semiconductor element 3 is mounted on the wiring circuit substrate 1, and the gap between the aforementioned wiring circuit substrate 1 and semiconductor element 3 is filled with the filling resin layer 4 comprising the liquid epoxy resin composition 10, under such a condition that the electrode part for connection (joint ball) 2 disposed on the semiconductor element (flip chip) 3 and the circuit electrode 5 disposed on the wiring circuit substrate 1 are facing with each other, is produced.

In addition, thickness and weight of the aforementioned liquid epoxy resin composition 10 are optionally set in the same manner as described in the foregoing, based on the size of the semiconductor element 3 to be mounted and the size of the spherical electrode part for connection 2 disposed on the semiconductor element 3, that is, based on the occupying volume of the filling resin layer 4 formed by filling and filling the gap between the semiconductor element 3 and wiring circuit substrate 1.

Also, as the heating temperature in changing the aforementioned liquid epoxy resin composition 10 to a low viscosity state by heating the same in the aforementioned production, it may be appropriately set by taking into consideration heat resistance of the semiconductor element 3 and wiring circuit substrate 1, melting point of the electrode part for connection 2 and room temperature viscosity, heat resistance and the like of the liquid epoxy resin composition.

The gap distance between the semiconductor element (flip chip) 3 and the wiring circuit substrate 1 of the electrical part device thus obtained is generally from about 30 to 300 μm.

Cured product of the epoxy resin composition in the filling part of the electronic part device obtained in this manner swells by a specific organic solvent and its adhesive strength therefore is reduced even after the curing, so that the electronic part device can be repaired.

As the aforementioned specified organic solvent, a ketone solvent, a glycol diether solvent, a nitrogenous solvent and the like are desirable. These may be used alone or as a mixture of two or more.

Examples of the aforementioned ketone solvent include acetophenone, isophorone, ethyl-n-butyl ketone, diisopropyl ketone, diethyl ketone, cyclohexyl ketone, di-n-propyl ketone, methyl oxide, methyl-n-amyl ketone, methyl isobutyl ketone, methyl ethyl ketone, methylcyclohexanone, methyl-n-heptyl ketone, phorone and the like. These may be used alone or as a mixture of two or more.

Examples of the aforementioned glycol diether solvent include ethylene glycol diethyl ether, ethylene glycol dibutyl ether, ethylene glycol dimethyl ether, diethylene glycol ethyl methyl ether, diethylene glycol diethyl ether, diethylene glycol dibutyl ether, diethylene glycol dimethyl ether, triethylene glycol dimethyl ether and the like. These may be used alone or as a mixture of two or more.

Examples of the aforementioned nitrogenous solvent includes N,N'-dimethylformamide, N,N'-dimethylacetamide, N-methyl-2-pyrrolidone, N,N'-dimethyl sulfoxide, hexamethylphosphor triamide and the like. These may be used alone or as a mixture of two or more.

As a repairing method for the aforementioned electronic part device, for example, the semiconductor element is removed by heating the repairing part of the semiconductor element (flip chip) or wiring circuit substrate using a heating plate. As the heating temperature of this case, when heated at a temperature of about +50° C. or more higher than the glass transition temperature of a cured product of the epoxy resin composition of the present invention, both (semiconductor element or wiring circuit substrate) can be easily peeled off under such a state that the cured product is under a cohesive failure or adhered to one side. Thereafter, when the aforementioned organic solvent is directly applied thereto or absorbent cotton impregnated with the aforementioned organic solvent is allowed to contact with the residual part of the cured product of the epoxy resin composition of the wiring circuit substrate at room temperature, and then the residue is removed after confirming swelling of the hardened product, the wiring circuit substrate can be reused. On the other hand, the semiconductor element (flip chip) to which the residue of cured product of the liquid epoxy resin composition is adhered, the semiconductor element (flip chip) can be reused by soaking it in the aforementioned organic solvent in a predetermined container and removing the thus swelled cured product.

Alternatively, though it requires a treatment for a prolonged period of time, the semiconductor element can also be detached from the wiring circuit substrate by directly applying the aforementioned organic solvent to the entire repairing part of the aforementioned wiring circuit substrate or covering the same with absorbent cotton impregnated with the organic solvent, and thereby reducing strength and adhesive strength of the cured product through its swelling by gradually permeating the organic solvent from the end of the semiconductor element.

EXAMPLES

Next, Examples are described together with comparative examples.

Firstly, respective components shown below were prepared.

Liquid Epoxy Resin a:

An epoxy resin represented by the following structural formula (5)

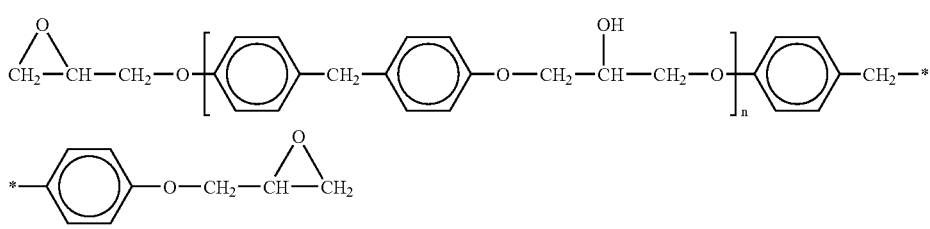

(5)

(In the formula (5), n is a positive number of 0 or more (preferably a positive number of from 0 to 300, more preferably a positive number of from 0 to 10). Purity 99%, viscosity 22 dPa·s (25° C.), epoxy equivalent 165 g/eq)

Liquid Epoxy Resin b:

A multifunctional epoxy compound represented by the following structural formula (6)

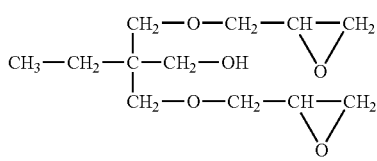

(6)

(In the formula (6), viscosity 0.6 dPa·s (25° C.), epoxy equivalent 125 g/eq)

Curing Agent a:

A fluorine-containing aromatic diamine represented by the following structural formula (7).

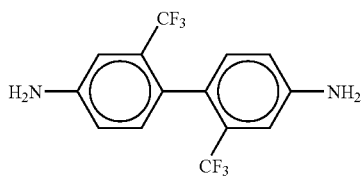

(7)

(In the formula (7), melting point 182° C., active hydrogen equivalent 80 g/eq)

Curing Agent b:

A fluorine-containing aromatic diamine derivative represented by the following structural formula (8) obtained by putting 1 mol of 2,2'-di(trifluoromethyl)-4,4'-diaminobiphenyl represented by the aforementioned structural formula (7) and 0.5 mol of butyl glycidyl ether in that ratio into a reaction vessel and allowing them to undergo the reaction at 200° C.

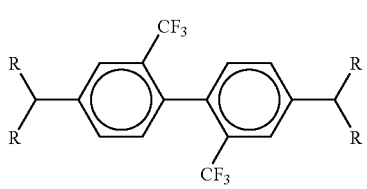

(8)

(In the formula (8), in the four of R, 3.5 in average are hydrogen, and 0.5 in average is —$CH_2$—$CH(OH)CH_2$—O—$C_4H_9$. Also, average active hydrogen equivalent is 110 g/eq.)

N,N,N',N'-tetra-substituted fluorine-containing aromatic diamine compound:

An N,N,N',N'-tetra-substituted fluorine-containing aromatic diamine compound represented by the following structural formula (9).

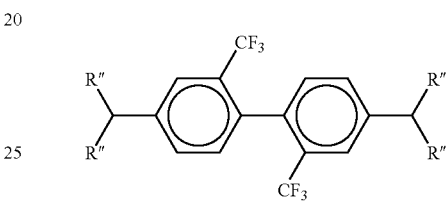

(9)

(In the formula (9), R" is —$CH_2$—$CH(OH)CH_2$—O—$C_4H_9$.)

Prepolymer a:

A prepolymer a (active hydrogen equivalent 325) which is a starch syrup-like viscous liquid obtained by allowing 0.5 equivalent (82.5 g) of the multifunctional epoxy resin represented by the aforementioned structural formula (5) to react with 1 active hydrogen equivalent (80 g) of the fluorine-containing aromatic diamine represented by the aforementioned structural formula (7) at 150° C. for 15 minutes and then cooling the product.

Prepolymer b:

A prepolymer b (viscosity 10 dPa·s, weight average molecular weight 560) obtained by charging a reaction vessel with 1 mole of the fluorine-containing aromatic diamine derivative represented by the aforementioned structural formula (8) and 4 moles of the multifunctional epoxy resin represented by the aforementioned structural formula (6) and allowing them to undergo the reaction at 100° C. for 10 minutes.

Inorganic Filler:

Spherical silica particles (maximum particle diameter 12 μm, average particle diameter 4 μm, specific surface area 3.0 m²/g).

Carboxylic Acid Vinyl Ether Addition Product a:

An adipic acid cyclohexyl divinyl ether addition product containing a structural unit represented by the following structural formula (a) as the main component (acid equivalent 273 g/mol, viscosity 26 dPa·s, weight average molecular weight 2,050, number average molecular weight 1,405).

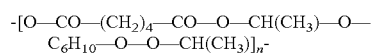

(a)

Carboxylic Acid Vinyl Ether Addition Product b:

A maleic acid cyclohexyl divinyl ether addition product represented by the following structural formula (b)=acid equivalent 254 g/mol, grease-like viscous liquid, weight average molecular weight 2,300, number average molecular weight 1,300).

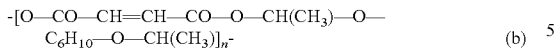
-[O—CO—CH=CH—CO—O—CH(CH$_3$)—O—C$_6$H$_{10}$—O—CH(CH$_3$)]$_n$- (b)

Examples 1 to 14 and Comparative Examples 1 to 3

One-component non-solvent liquid epoxy resin compositions were prepared by blending respective components prepared in the above at the ratios shown in the following Table 1 to Table 4, and uniformly mixing and dispersing them at room temperature (25° C.) using three rollers.

TABLE 1

| | | (part by weight) Examples | | | | | |
|---|---|---|---|---|---|---|---|
| | | 1 | 2 | 3 | 4 | 5 | 6 |
| Liquid epoxy resin | a | 0.825 | 0.825 | 0.825 | 0.825 | 0.825 | 0.825 |
| | b | 0.625 | 0.625 | 0.625 | 0.625 | 0.625 | 0.625 |
| Curing agent | a | — | — | — | — | — | — |
| | b | 0.88 | 0.88 | 0.88 | 0.88 | 0.22 | 0.66 |
| N,N,N',N'-tetra-substituted fluorine-containing aromatic diamine compound | | 1.55 | 0.78 | 2.85 | 1.55 | 1.55 | 1.55 |
| Carboxylic acid vinyl ether addition product | a | 0.19 | 0.16 | 0.26 | 0.02 | 0.08 | 0.31 |
| | b | — | — | — | — | — | — |
| Prepolymer | a | — | — | — | — | — | — |
| | b | — | — | — | — | — | — |
| Inorganic filler | | — | — | — | — | — | — |

TABLE 2

| | | (part by weight) Examples | | | | | |
|---|---|---|---|---|---|---|---|
| | | 7 | 8 | 9 | 10 | 11 | 12 |
| Liquid epoxy resin | a | 0.825 | 0.825 | 0.825 | 0.825 | 0.825 | 0.825 |
| | b | 0.625 | 0.625 | 0.625 | 0.625 | 0.625 | 0.625 |
| Curing agent | a | — | 0.64 | — | — | — | — |
| | b | 0.88 | — | 0.88 | 0.88 | 0.88 | 0.88 |
| N,N,N',N'-tetra-substituted fluorine-containing aromatic diamine compound | | 1.55 | 1.39 | 1.55 | 1.55 | 0.78 | 2.85 |
| Carboxylic acid vinyl ether addition product | a | 0.70 | 0.17 | 0.19 | — | — | — |
| | b | — | — | — | 0.19 | 0.16 | 0.26 |
| Prepolymer | a | — | — | — | — | — | — |
| | b | — | — | — | — | — | — |
| Inorganic filler | | — | — | 4.07 | 4.07 | — | — |

TABLE 3

| | | (part by weight) Examples | |
|---|---|---|---|
| | | 13 | 14 |
| Liquid epoxy resin | a | 0.413 | 0.825 |
| | b | 0.625 | — |
| Curing agent | a | — | — |
| | b | — | — |

TABLE 3-continued

| | | (part by weight) Examples | |
|---|---|---|---|
| | | 13 | 14 |
| N,N,N',N'-tetra-substituted fluorine-containing aromatic diamine compound | | 1.394 | 1.553 |
| Carboxylic acid vinyl ether addition product | a | 0.17 | 0.24 |
| | b | — | — |
| Prepolymer | a | 1.053 | — |
| | b | — | 1.505 |
| Inorganic filler | | — | — |

TABLE 4

| | | (part by weight) Comparative Examples | | |
|---|---|---|---|---|
| | | 1 | 2 | 3 |
| Liquid epoxy resin | a | 0.825 | 0.825 | 0.825 |
| | b | 0.625 | 0.625 | — |
| Curing agent | a | — | — | — |
| | b | 0.88 | 0.88 | — |
| N,N,N',N'-tetra-substituted fluorine-containing aromatic diamine compound | | 1.55 | 1.55 | 1.553 |
| Carboxylic acid vinyl ether addition product | a | — | — | — |
| | b | — | — | — |
| Prepolymer | a | — | — | — |
| | b | — | — | 1.505 |
| Inorganic filler | | — | 2.33 | — |

Using each of the thus obtained liquid epoxy resin compositions of Examples and Comparative Examples, its viscosity at 25° C. was measured using an EMD type rotational viscometer, and then packed in a polypropylene syringe equipped with a needle of 0.56 mm in needle inner diameter.

Thereafter, the liquid epoxy resin composition was applied using the aforementioned syringe in advance to the solder pads (substrate-side electrodes)—containing semiconductor element arranging face of a wiring circuit substrate of 1 mm in thickness made of FR-4 glass-epoxy, in which 64 wiring pads of 300 μm in diameter are opened (substrate-side electrodes). On the other hand, a silicon chip (370 μm in thickness, 10 mm×10 mm in size) having 64 solder bump electrodes of 200 μm in diameter was prepared, the aforementioned substrate-side electrodes of the wiring circuit substrate and the bump electrodes of the face down silicon chip were aligned, and the silicon chip was allowed to stand on the wiring circuit substrate. This was heated to 60° C. on a heating stage and then solder-bonded by passing through a heating reflow furnace under a condition of 240° C. for 10 seconds. The gap between the aforementioned flip chip and wiring circuit substrate was 210 μm. Thereafter, its filling was carried out by curing it at 150° C. for 4 hours to prepare respective electronic part devices.

After completion of the curing, they were gradually cooled down to room temperature and then their electrical connection was examined by circuit testing. As a result, a case in which electrical connection was obtained was expressed as O, and a case in which continuity was not obtained was expressed as X.

In addition, the presence or absence of voids in the filling resin layer which filled and filled the gap between the wiring circuit substrate and semiconductor element was observed by an ultrasonic flaw detector. A case in which voids were not observed was evaluated as O, and a case in which 1 or 2 voids were observed as Δ, and a case in which more voids were observed as X.

Using the respective electronic part devices obtained in this manner, their defect percentage in connectivity and repairing ability were measured and evaluated in accordance with the methods shown in the following. The results are shown in the following Table 5 to Table 8, together with measured physical property of the aforementioned liquid epoxy resin composition.

Defect Percentage in Connectivity:

Defect percentage in connectivity of the aforementioned electronic part device just after filling was measured. The aforementioned electronic part device was subjected to a temperature cycle test of −30° C./10 minutes ⇔125° C./10 minutes using a thermal test device to examine electrical continuity after 1,000 cycles, and then the defect percentage in connectivity (%) was calculated by carrying out a connection reliability test on all of the 64 copper wiring pads of the aforementioned glass-epoxy wiring circuit substrate.

Repairing Ability:

After measuring the aforementioned defect percentage in connectivity, silicon chip was peeled off from the aforementioned electronic part device on a heating plate heated to 200° C. and the remaining part was returned to room temperature, and absorbent cotton impregnated with a mixed solvent of N,N'-dimethylformamide and diethylene glycol dimethyl ether (same volume) was put on the residual part of the cured product of epoxy resin component remaining on the connecting parts of the aforementioned remaining part and allowed to stand at room temperature (22° C.) for 1 hour. Thereafter, this absorbent cotton was removed and removing of the cured product of epoxy resin component was carried out by thoroughly wiping with methanol. After supply of solder paste to pad parts of the wiring circuit substrate and subsequent solder melting, electrical continuity of the peelable electronic part device was again examined by mounting a silicon chip on the wiring circuit substrate in the same manner as described in the above. Thereafter, this was filled to carry out evaluation of repair (rework) ability in the same manner as described in the above.

A case in which cured product of the epoxy resin composition is completely removable and the electrical connection is perfect was expressed as ⊚, and a case in which the cured product can be peeled off though it slightly remains, but the electrical connection is perfect as O, a case in which the cured product can be peeled off though it slightly remains, but the electrical connection is imperfect as Δ, and a case in which cured product of the epoxy resin composition can hardly be peeled off, and the electrical connection is imperfect as X.

TABLE 5

|  | Examples | | | | | |
| --- | --- | --- | --- | --- | --- | --- |
|  | 1 | 2 | 3 | 4 | 5 | 6 |
| Viscosity (at 25° C.) (dPa · s) | 52 | 55 | 52 | 53 | 54 | 48 |
| Defect percentage in connectivity (%) | 0 | 0 | 0 | 0 | 0 | 0 |
| Voids | O | O | O | O | O | O |
| Electrical connection test | O | O | O | O | O | O |
| Repair ability (22° C.) | O | O | O | O | O | O |

TABLE 6

|  | Examples | | | | | |
| --- | --- | --- | --- | --- | --- | --- |
|  | 7 | 8 | 9 | 10 | 11 | 12 |
| Viscosity (at 25° C.) (dPa · s) | 44 | 120 | 250 | 280 | 64 | 59 |
| Defect percentage in connectivity (%) | 0 | 0 | 0 | 0 | 0 | 0 |
| Voids | O | O | O | O | O | O |
| Electrical connection test | O | O | O | O | O | O |
| Repair ability (22° C.) | O | O | O | O | O | O |

TABLE 7

|  | Examples | |
| --- | --- | --- |
|  | 13 | 14 |
| Viscosity (at 25° C.) (dPa · s) | 75 | 68 |
| Defect percentage in connectivity (%) | 0 | 0 |
| Voids | O | O |
| Electrical connection test | O | O |
| Repair ability (22° C.) | O | O |

TABLE 8

|  | Comparative Examples | | |
| --- | --- | --- | --- |
|  | 1 | 2 | 3 |
| Viscosity (at 25° C.) (dPa · s) | 51 | 180 | 71 |
| Defect percentage in connectivity (%) | 100 | 100 | 100 |
| Voids | O | O | O |
| Electrical connection test | not testable | not testable | not testable |
| Repair ability (22° C.) | O | O | O |

Based on the results of the aforementioned Table 5 to Table 8, it is evident that all of the liquid epoxy resin compositions of Examples are also superior in the repair property, because voids were not generated in the filling resin layer, and there was no defect percentage in connectivity due to the use of the carboxylic acid vinyl ether addition product as a flux component. In addition, it is apparent that they are excellent as void-less, one-component non-solvent liquid epoxy resin compositions combined with low viscosity.

Contrary to this, the liquid epoxy resin composition of Comparative Example 1 showed good repair ability, but its continuity itself was not obtained because of the absence of the carboxylic acid vinyl ether addition product as a flux component. Also, in the same manner, the continuity itself was not obtained in the preparations of other Comparative Examples because of the absence of flux component.

While the invention has been describe in detail and with reference to specific embodiments thereof, it will be apparent to one skilled in the art that various changes and modifications can be made therein without departing from the spirit and scope of the invention.

This application is based on a Japanese patent application filed on Dec. 25, 2002 (Japanese Patent Application No. 2002-374735), the entire contents thereof being thereby incorporated by reference.

INDUSTRIAL APPLICABILITY

As described in the above, the present invention is an electronic part device in which the gap between the circuit substrate and semiconductor element is filled with a filling resin layer comprising a liquid epoxy resin composition containing a carboxylic acid vinyl ether addition product (component D) together with a liquid epoxy resin (component A), a curing agent (component B) and an N,N,N',N'-tetra-substituted fluorine-containing aromatic diamine compound (component C). Since the aforementioned carboxylic acid vinyl ether addition product (component D) as a reflux component is blended in the aforementioned liquid epoxy resin composition, the filling can be achieved simultaneously with the electrical connection of flip chip as the semiconductor element and the wiring circuit substrate, so that the productivity becomes excellent. What is more, it easily swells at room temperature by undergoing salvation by a specific organic solvent even after its curing. As a result, strength of the cured product is considerably reduced so that it is possible to easily peel it off from an adherend (electrode or the like). Thus, the electronic part device obtained by carrying out filling using the aforementioned liquid epoxy resin composition has superior productivity and connection reliability, and it is not necessary to discard the electronic part device itself even when a connection failure is generated due to positional slippage between electrodes or the like, so that an electronic part device having superior repair ability can be obtained.

When the aforementioned specific compound represented by the general formula (1) is used as the aforementioned N,N,N',N'-tetra-substituted fluorine-containing aromatic diamine compound (component C), it exerts favorable effect in which easiness for repairing can be resulted by quick swelling ability, which is desirable.

In addition, when the aforementioned fluorine-containing aromatic diamine represented by the general formula (2) is used as the curing agent (component B), and a prepolymer prepared by allowing this to react with the liquid epoxy resin (component A) is used, further improvement of curing speed can be attained. What is more, since it can be formed in advance into a condition of from a liquid state to a viscous paste state, complex steps are not necessary in the measurement at the time of blending and dispersing step thereafter, so that the liquid epoxy resin composition can be easily obtained.

The invention claimed is:

1. An electronic part device comprising a semiconductor circuit substrate, a semiconductor element mounted thereon in such a way that an electrode part for connection disposed on the semiconductor element and an electrode part for connection disposed on the circuit substrate are facing with each other, and a filling resin layer which fills a gap between the circuit substrate and semiconductor element, wherein the filling resin layer comprises a liquid epoxy resin composition which comprises the following component (D) and the following components (A) to (C):
   (A) a liquid epoxy resin,
   (B) a curing agent,
   (C) an N,N,N',N'-tetra-substituted fluorine-containing aromatic diamine compound, and
   (D) a carboxylic acid vinyl ether addition product.

2. The electronic part device described in claim 1, wherein the aforementioned N,N,N',N'-tetra-substituted fluorine-containing aromatic diamine compound as the component (C) is a compound represented by the following general formula (1):

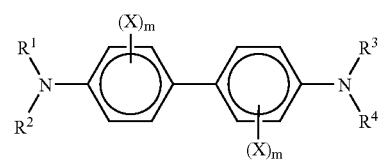

(in the formula (1), X is fluorine and/or $C_nF_{2n+}$ (n is a positive number of from 1 to 10), m is an integer of from 1 to 4, and $R^1$ to $R^4$ are monovalent organic groups other than hydrogen, which may be the same or different from one another).

3. The electronic part device described in claim 1, wherein the N,N,N',N'-tetra-substituted fluorine-containing aromatic diamine compound as the component (C) is a reaction product of 2,2'-di(trifluoromethyl)-4,4'-diaminobiphenyl with a mono-epoxy compound containing one epoxy group in one molecule.

4. The electronic part device described in claim 1, wherein the content of the N,N,N',N'-tetra-substituted fluorine-containing aromatic diamine compound as the component (C) is set to a range of from 10 to 70% by weight, more preferably from 20 to 40% by weight, based on the entire organic components of the liquid epoxy resin composition.

5. The electronic part device described in claim 1, wherein the curing agent as the component (B) is at least one of the fluorine-containing aromatic diamine represented by the following general formula (2) and a derivative thereof:

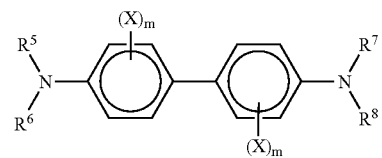

(in the formula (2), X is fluorine and/or $C_nF_{2n+1}$ (n is a positive number of from 1 to 10), m is an integer of from 1 to 4, each of $R^5$ to $R^8$ is hydrogen or a monovalent organic group, and at least one of $R^5$ to $R^8$ is hydrogen).

6. The electronic part device described in claim 5, which comprises a prepolymer prepared by allowing at least one of the fluorine-containing aromatic diamine represented by the aforementioned general formula (2) and a derivative thereof to react with the liquid epoxy resin as the component (A).

7. The electronic part device described in claim 3, wherein the mono-epoxy compound containing one epoxy group in one molecule is at least one compound selected from the group consisting of n-butyl glycidyl ether, allyl glycidyl ether, 2-ethylhexyl glycidyl ether, styrene oxide, phenyl glycidyl ether, cresyl glycidyl ether, lauryl glycidyl ether, p-sec-butylphenyl glycidyl ether, nonylphenyl glycidyl ether, glycidyl ether of carbinol, glycidyl methacrylate, vinylcyclohexene monoepoxide and α-pinene oxide.

8. The electronic part device described in claim 1, wherein the carboxylic acid vinyl ether addition product as the component (D) is a carboxylic acid monovinyl ether addition product represented by the following general formula (3)

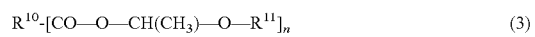

(in the formula (3), $R^{10}$ is an organic group of monovalent or more, $R^{11}$ is an organic group of monovalent or more, wherein they may be the same or different from each other, and n is a positive integer).

9. The electronic part device described in claim 1, wherein the carboxylic acid vinyl ether addition product as the component (D) is a polyvalent carboxylic acid polyvalent vinyl ether addition product having a structural unit represented by the following general formula (4) as the main moiety

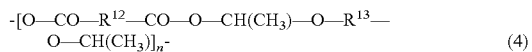
(4)

(in the formula (4), $R^{12}$ and $R^{13}$ are divalent organic groups, wherein they may be the same or different from each other, and n is a positive integer).

10. The electronic part device described in claim 1, which further comprises an inorganic filler in the liquid epoxy resin composition containing the components (A) to (D).

11. The electronic part device described in claim 10, wherein the inorganic filler is a spherical silica powder having an average particle diameter of 10 μm or less.

* * * * *